United States Patent
Honda et al.

(10) Patent No.: US 8,841,954 B2
(45) Date of Patent: Sep. 23, 2014

(54) INPUT SIGNAL PROCESSING DEVICE

(71) Applicant: DENSO CORPORATION, Kariya (JP)

(72) Inventors: Takuya Honda, Nagoya (JP); Takuya Harada, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/913,655

(22) Filed: Jun. 10, 2013

(65) Prior Publication Data
US 2013/0335125 A1 Dec. 19, 2013

(30) Foreign Application Priority Data

Jun. 15, 2012 (JP) ................................ 2012-135786

(51) Int. Cl.
*H03K 3/013* (2006.01)
*H03K 3/012* (2006.01)
*H03K 5/1252* (2006.01)

(52) U.S. Cl.
CPC .................................. *H03K 3/012* (2013.01); *H03K 5/1252* (2013.01)
USPC ........................................... 327/292; 331/34

(58) Field of Classification Search
CPC ........ H03K 3/012; H03K 3/013; H03K 3/014
USPC ........................................... 327/292; 331/34
See application file for complete search history.

(56) References Cited

U.S. PATENT DOCUMENTS 5,719,517 A 2/1998 Nakao
2005/0093636 A1* 5/2005 Jasniewicz et al. ............. 331/34

FOREIGN PATENT DOCUMENTS

| JP | 1992-142109 A | 5/1992 |
| JP | 07-020963 A | 1/1995 |
| JP | 2006-174187 A | 6/2006 |
| JP | 2006-285823 A | 10/2006 |
| JP | 2007-251603 A | 9/2007 |
| JP | 2007-281642 A | 10/2007 |
| JP | 2009-188596 A | 8/2009 |

OTHER PUBLICATIONS

Office Action mailed Jun. 3, 2014 in corresponding JP application No. 2012-135786. (with English Translation).

* cited by examiner

*Primary Examiner* — John Poos
(74) *Attorney, Agent, or Firm* — Posz Law Group, PLC

(57) ABSTRACT

An input signal processing device includes an oscillator circuit, a signal processing circuit, and a control circuit. The oscillator circuit performs an oscillation operation to output a clock signal. The signal processing circuit operates based on the clock signal outputted from the oscillator circuit. The signal processing circuit performs a predetermined process to an input signal when a level of the input signal changes and outputs a signal after the predetermined process. The control circuit instructs the oscillator circuit to start the oscillation operation based on a level change of the input signal. The control circuit instructs the oscillator circuit to stop the oscillation operation when the signal processing circuit finishes the predetermined process.

7 Claims, 9 Drawing Sheets

INPUT SIGNAL PROCESSING DEVICE

CROSS REFERENCE TO RELATED APPLICATIONS

The present application is based on and claims priority to Japanese Patent Application No. 2012-135786 filed on Jun. 15, 2012, the contents of which are incorporated in their entirety herein by reference.

TECHNICAL FIELD

The present disclosure relates to an input signal processing device.

BACKGROUND

JP-A-7-20963 discloses an example of a signal processing device that performs a predetermined process to an input signal based on a clock signal outputted from an oscillator circuit when a level of the input signal changes. In the signal processing device, when a signal is not inputted, a system clock is stopped so as to reduce power consumption.

However, in the signal processing device, even after an external signal is determined as not noise but a normal signal, an operation of the oscillator circuit continues for a predetermined time. Thus, the power consumption cannot be reduced sufficiently.

SUMMARY

An object of the present disclosure is to provide an input signal processing device that can reduce power consumption.

An input signal processing device according to an aspect of the present disclosure includes an oscillator circuit, a signal processing circuit, and a control circuit. The oscillator circuit performs an oscillation operation to output a clock signal. The signal processing circuit operates based on the clock signal outputted from the oscillator circuit. The signal processing circuit performs a predetermined process to an input signal when a level of the input signal changes and outputs a signal after the predetermined process. The control circuit instructs the oscillator circuit to start the oscillation operation based on a level change of the input signal. The control circuit instructs the oscillator circuit to stop the oscillation operation when the signal processing circuit finishes the predetermined process.

In the input signal processing device, the oscillator circuit outputs the clock signal only for a period for which the signal processing circuit performs the predetermined process. Thus, the input signal processing device can reduce power consumption.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION (First Embodiment)

Figure 1:
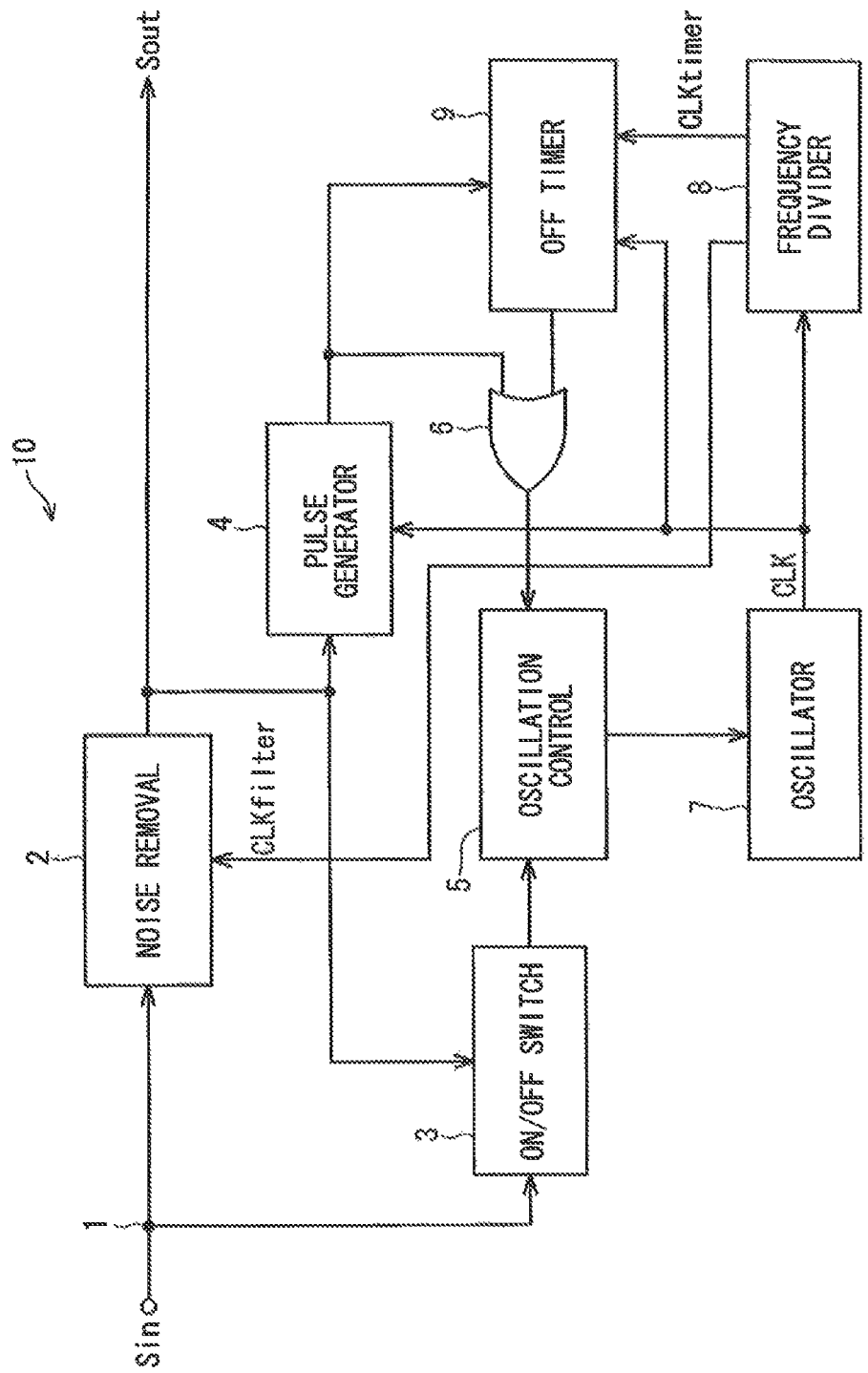
FIG. 1 is a functional block diagram of an input signal processing device according to a first embodiment of the present disclosure.

An input signal processing device 10 according to a first embodiment of the present disclosure will be described with reference to FIG. 1 to FIG. 4. As shown in FIG. 1, an external input signal Sin, which is inputted to an input terminal 1 from an external device, is inputted to a noise removal circuit 2 (signal processing circuit) and an ON/OFF switch circuit 3 (control circuit). The noise removal circuit 2 is configured as a digital filter. The noise removal circuit 2 removes noises superimposed in a rising period and a falling period of the external input signal and outputs a signal after removal (hereafter, referred to as filter output signal Sout) to an external device or a subsequent circuit. The filter output signal is also inputted to the ON/OFF switch circuit 3 and a one-shot pulse generator circuit 4 (control circuit, first stop signal output circuit).

The ON/OFF switch circuit 3 outputs an oscillation start signal Ostart to an oscillation control circuit 5 based on the external input signal and the filter output signal. The one-shot pulse generator circuit 4 generates a one-shot pulse signal based on the filter output signal and a clock signal CLK and outputs an oscillation stop signal Ostop (first trigger signal) to the oscillation control circuit 5 (control circuit) via an OR gate 6. The oscillation control circuit 5 outputs an oscillation control signal Ocont to an oscillator circuit 7. The oscillator circuit 7 performs an oscillation operation only for a period for which the oscillation control signal is at a high level.

The oscillator circuit 7 outputs the clock signal CLK to the one-shot pulse generator circuit 4, a frequency divider circuit 8, and an off timer circuit 9 (control circuit, second stop signal output circuit). The frequency divider circuit 8 divides a frequency of the clock signal CLK and generates divided clock signals CLKfilter and CLKtimer. The divided clock signal CLKfilter is inputted to the noise removal circuit 2, and the divided clock signal CLKtimer is inputted to the off timer circuit 9. The off timer circuit 9 performs a count operation, that is, measures a time, based on the clock signal CLK and the clock signal CLKtimer, thereby generating a one-shot pulse and outputting an off timer signal (second trigger signal). The off timer circuit 9 receives the one-shot pulse signal from the one-shot pulse generator circuit 4 as a reset signal.

Figure 2:
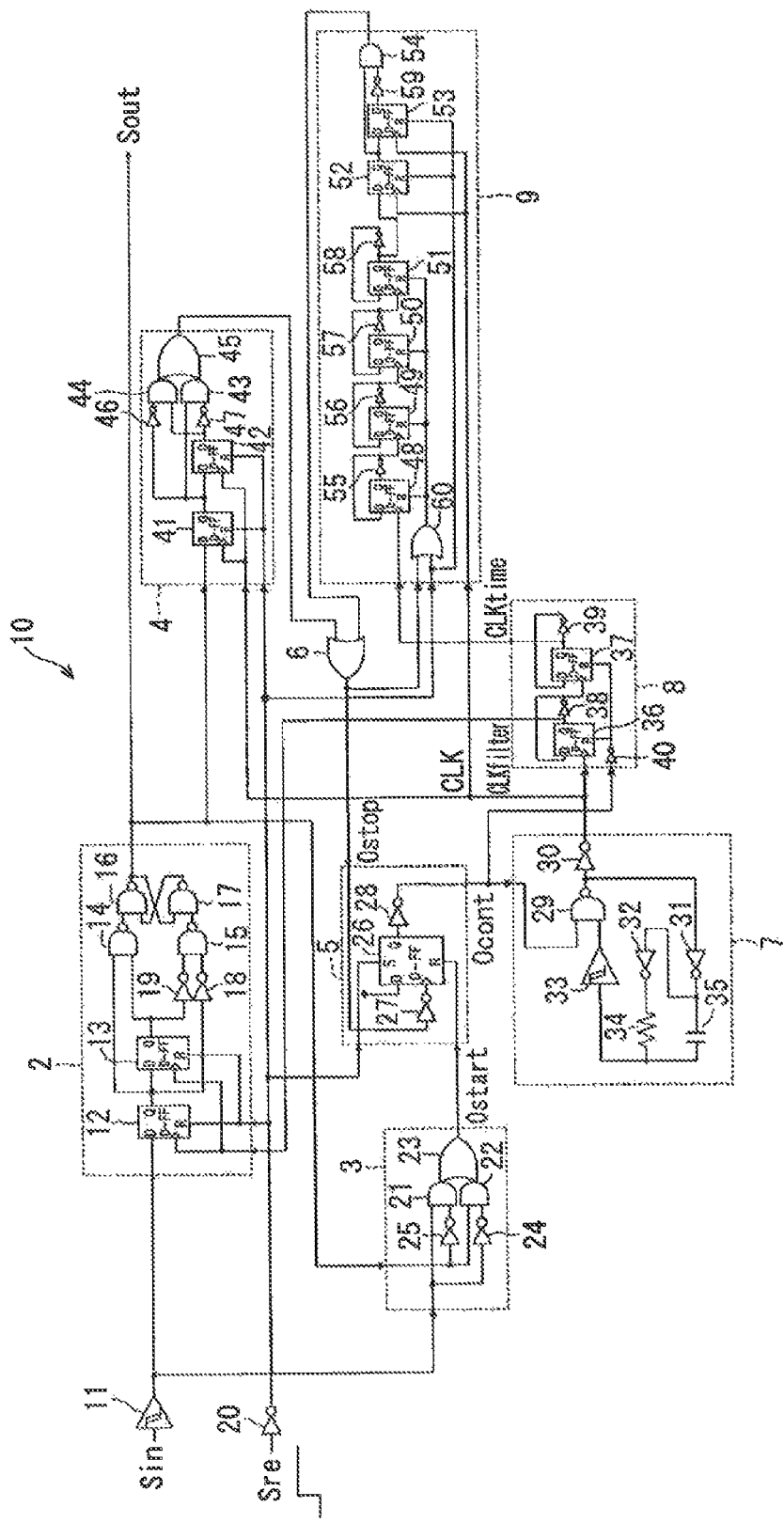
FIG. 2 is a circuit diagram of the input signal processing device shown in FIG. 1

As shown in FIG. 2, the noise removal circuit 2 receives the external input signal Sin via a Schmitt trigger buffer 11. The noise removal circuit 2 includes D flip flops 12, 13 (first and second flip flops), NAND gates 14-17 (first to fourth NAND gates), and NOT gates 18, 19. The D flip flops 12, 13 are coupled in series. An input terminal D of the D flip flop 12 is coupled to an output terminal of the Schmitt trigger buffer 11.

Output terminals Q of the D flip flops 12, 13 are coupled to an input terminal of the NAND gate 14 and are coupled to an input terminal of the NAND gate 15 via the NOT gates 18, 19. An output terminal of the NAND gate 14 is coupled to one input terminal of the NAND gate 16. An output terminal of the NAND gate 15 is coupled to one input terminal of the NAND gate 17. The other input terminal of the NAND gate 16 is coupled to an output terminal of the NAND gate 17. The other input terminal of the NAND gate 17 is coupled to an output terminal of the NAND gate 16. The output terminal of the NAND gate 16 functions as an output terminal of the noise removal circuit 2. A low active reset signal (Sre), which is outputted from an external device, is inputted to reset terminals R of the D flip flops 12, 13 via a NOT gate 20.

The ON/OFF switch circuit 3 includes AND gates 21, 22, an OR gate 23, and NOT gates 24, 25. The output terminal of the Schmitt trigger buffer 11 is coupled to one input terminal of the AND gate 21 and is also coupled to one input terminal of the AND gate 22 via the NOT gate 24. The output terminal of the noise removal circuit 2 is coupled to the other input terminal of the AND gate 22 and is also coupled to the other input terminal of the AND gate 21 via the NOT gate 25. Output terminals of the AND gates 21, 22 are coupled to input terminals of the OR gate 23. An output terminal of the OR gate 23 functions as an output terminal of the ON/OFF switch circuit 3.

The oscillation control circuit 5 includes a D flip flop 26 and NOT gates 27, 28. The output terminal of the ON/OFF switch circuit 3 is coupled to a reset terminal R of the D flip flop 26. A set terminal S of the D flip flop 26 is coupled to an output terminal of the NOT gate 20. An input terminal D of the D flip flop 26 is pulled up to a power source level. A clock tei final of the D flip flop 26 is coupled to an output terminal of the OR gate 6 via the NOT gate 27. An output terminal Q of the D flip flop 26 is coupled to the NOT gate 28. An output terminal of the NOT gate 28 functions as an output terminal of the oscillation control circuit 5.

The oscillator circuit 7 includes a NAND gate 29, NOT gates 30-32, a Schmitt trigger buffer 33, a resistance element 34, and a capacitor 35. The output terminal of the oscillation control circuit 5 is coupled to one input terminal of the NAND gate 29. An output terminal of the NAND gate 29 is coupled to an input terminal of the NAND gate 29 via a series circuit of the NOT gate 31, the capacitor 35, and the Schmitt trigger buffer 33. The capacitor 35 is coupled in parallel with a series circuit of the NOT gate 32 and the resistance element 34. The output terminal of the NAND gate 29 functions as an output terminal of the oscillator circuit 7 via the NOT gate 30.

The frequency divider circuit 8 includes D flip flops 36, 37 and NOT gates 38-40. A clock terminal of the D flip flop 36 is coupled to the output terminal of the oscillator circuit 7. An output terminal Q of the D flip flop 36 is a terminal that outputs the divided clock signal CLKfilter and is coupled to an input terminal D of the D flip flop 36 via the NOT gate 38. An output terminal of the NOT gate 38 is coupled to a clock terminal of the D flip flop 37. An output terminal Q of the D flip flop 37 is a terminal that outputs the divided clock signal CLKtime and is coupled to an input terminal D of the D flip flop 37 via the NOT gate 39. Reset terminals R of the D flip flops 36, 37 are coupled to the output terminal of the oscillation control circuit 5 via the NOT gate 40.

The one-shot pulse generator circuit 4 includes D flip flops 41, 42, AND gates 43, 44, an OR gate 45, and NOT gates 46, 47. The D flip flops 41, 42 are coupled in series, and an input terminal of the D flip flop 41 is coupled to the output terminal of the noise removal circuit 2. An output terminal Q of the D flip flop 41 is coupled to one input terminal of the AND gate 43, and is coupled to one input terminal of the AND gate 44 via the NOT gate 46. An output terminal Q of the D flip flop 42 is coupled to the other input terminal of the AND gate 44 and is coupled to the other input terminal of the AND gate 43 via the NOT gate 47.

Output terminals of the AND gates 43, 44 are coupled to input terminals of the OR gate 45. An output terminal of the OR gate 45 functions as an output terminal of the one-shot pulse generator circuit 4. Clock terminals of the D flip flops 41, 42 receive clock signals CLK. Reset terminals R of the D flip flops 41, 42 are coupled to the output terminal of the NOT gate 20.

The off timer circuit 9 includes D flip flops 48-53, an AND gate 54, a NOT gate 55-59, and an OR gate 60. A clock terminal of the D flip flop 48 receives the divided clock signal CLKtime. The NOT gates 55-58 are respectively coupled between output terminals Q and input terminals D of the D flip flops 48-53, and output terminals of the NOT gates 55-57 are respectively coupled to clock terminals of the D flip flops 49-51.

The D flips flops 52, 53 are coupled in series, and an input terminal of the D flip flop 52 is coupled to an output terminal of the D flip flop 51. An output terminal Q of the D flip flop 52 is coupled to one input terminal of the AND gate 54. An output terminal Q of the D flip flop 53 is coupled to the other input terminal of the AND gate 54 via the NOT gate 59. Clock terminals of the D flip flops 52, 53 receive the clock signal CLK. An output terminal of the AND gate 54 functions as an output terminal of the off timer circuit 9.

Input terminals of the OR gate 60 are coupled to the output terminal of the OR gate 6 and the output terminal of the NOT gate 20. An output terminal of the OR gate 60 is coupled to reset terminals R of the D flip flops 48-51. Reset terminals R of the D flip flops 52, 53 are coupled to the output terminal of the NOT gate 20.

Next, an example of an operation of the input signal processing device 10 will be described below. Each of the circuits is in an initial state in which a reset is released, and the external input signal is at a low level. In this state, the filter output signal outputted from the noise removal circuit 2 and the oscillation start signal outputted from the ON/OFF switch circuit 3 are at the low level. In the oscillation control circuit 5, the D flip flop 26 is set. Thus, the oscillation control signal is at the low level, and the oscillation operation of the oscillator circuit 7 is stopped by the NAND gate 29.

Figure 3:
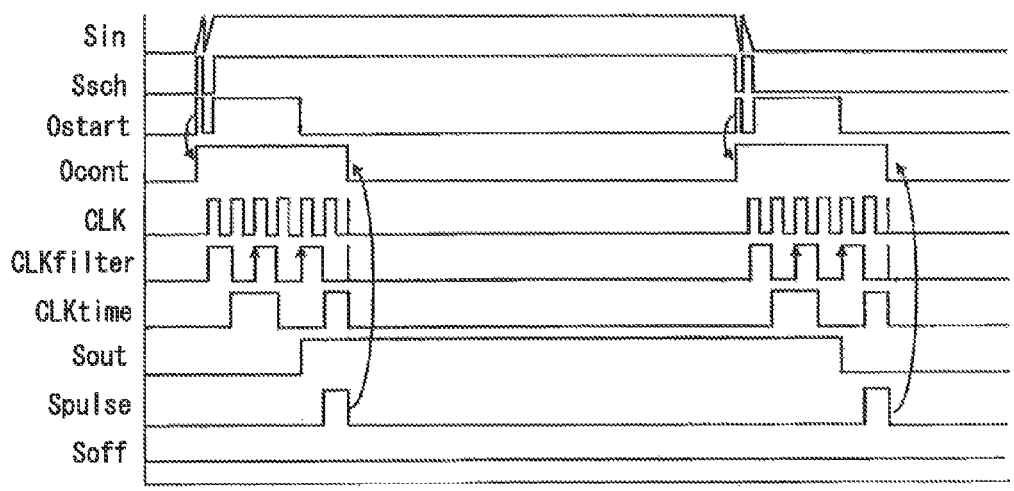
FIG. 3 is a timing chart showing a case where a normal signal is inputted to the input signal processing device.

As shown in FIG. 3, when noise is included when the external input signal Sin rises, the Schmitt trigger buffer 11 outputs a signal Ssch having a shaped waveform. Because a high level pulse corresponding to the noise is inputted, the ON/OFF switch circuit 3 brings the oscillation start signal Ostart to the high level. Accordingly, in the oscillation control circuit 5, the D flip flop 26 is reset, and the oscillation control signal Ocont transitions to the high level. In addition, the oscillator circuit 7 starts the oscillation operation to output the clock signal CLK. Then, the frequency divider circuit 8 outputs the divided clock signals CLKfilter, CLKtime. The divided clock signal CLKfilter is obtained by dividing the frequency of the clock signal CLK in half. The divided clock signal CLKtime is obtained by dividing the frequency of the divided clock signal CLKfilter in half.

In the noise removal circuit 2, when a rising edge of the divided clock signal CLKfilter is inputted in a state where the input terminal D of the D flip flop 12 is at the high level, the output terminal Q of the D flip flop 12 transitions to the high level. Then, when the next rising edge of the divided clock signal CLKfilter is inputted, the output terminal Q of the D flip flop 13 transitions to the high level. Accordingly, the filter output signal Sout transitions to the high level.

When the filter output signal Sout transitions to the high level, the ON/OFF switch circuit 3 brings the oscillation start signal ° start to the low level. When the one-shot pulse generator circuit 4 receives the rising edge of the clock signal CLK in a state where the filter output signal Sout is at the high level, the one-shot pulse generator circuit 4 outputs the one-shot pulse signal Spulse that keeps the high level until the next rising edge is inputted. The one-shot pulse signal Spulse is inputted to the oscillation control circuit 5 via the OR gate 6, a falling edge of the one-shot pulse signal Spulse triggers the D flip flop 26, and the oscillation control signal Ocont transitions to the low level. Accordingly, the oscillation operation of the oscillator circuit 7 stops.

The noise removal circuit 2 keeps the state unless the divided clock signal CLKfilter is supplied; the filter output signal Sout keeps the high level. When noise is superimposed also when the external input signal Sin falls, the Schmitt trigger buffer 11 outputs the signal Ssch having a shaped waveform. When the ON/OFF switch circuit 3 receives a low level pulse corresponding to the noise, the ON/OFF switch circuit 3 brings the oscillation start signal Ostart to the high level. Then, in a manner similar to the case of the rising, the oscillator circuit 7 starts the oscillation operation to output the clock signal CLK, and the frequency divider circuit 8 outputs the divided clock signals CLKfilter, CLKtime.

In the noise removal circuit 2, in a state where the input terminal D of the D flip flop 12 is at the low level, when a rising edge of the divided clock signal CLKfilter is inputted, the output terminal Q of the D flip flop 12 transitions to the low level, and when the next rising edge of the divided clock signal CLKfilter is inputted, the output terminal Q of the D flip flop 13 transitions to the low level. Accordingly, the filter output signal Sout transitions to the low level. Then, the ON/OFF switch circuit 3 brings the oscillation start signal Ostart to the low level.

When the one-shot pulse generator circuit 4 receives the rising edge of the clock signal CLK in a state where the filter output signal Sout is at the low level, the one-shot pulse generator circuit 4 outputs the one-shot pulse signal Spulse that keeps the high level until the next rising edge is inputted. Thus, the oscillation operation of the oscillator circuit 7 stops. Because the off timer circuit 9 is reset by the reset signal Sre from the external device or the one-shot pulse signal Spulse, the off timer circuit 9 does not output an off timer signal Soff in this case. As a result of the above-described operation, the noise superimposed in the rising period and the falling period of the external input signal Sin is removed by the noise removal circuit 2, and the input signal processing device 10 outputs the filter output signal Sout without noise. The operation of the oscillator circuit 7 is stopped except for a period for which the noise removal circuit 2 operates to remove noise.

Figure 4:
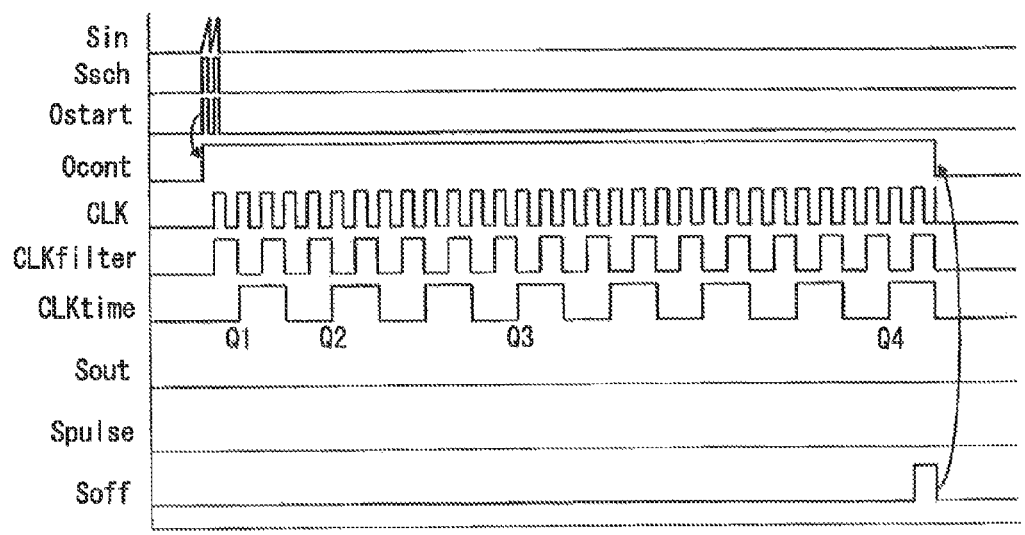
FIG. 4 is a timing chart showing a case where only noise is inputted to the input signal processing device.
Figure 5:
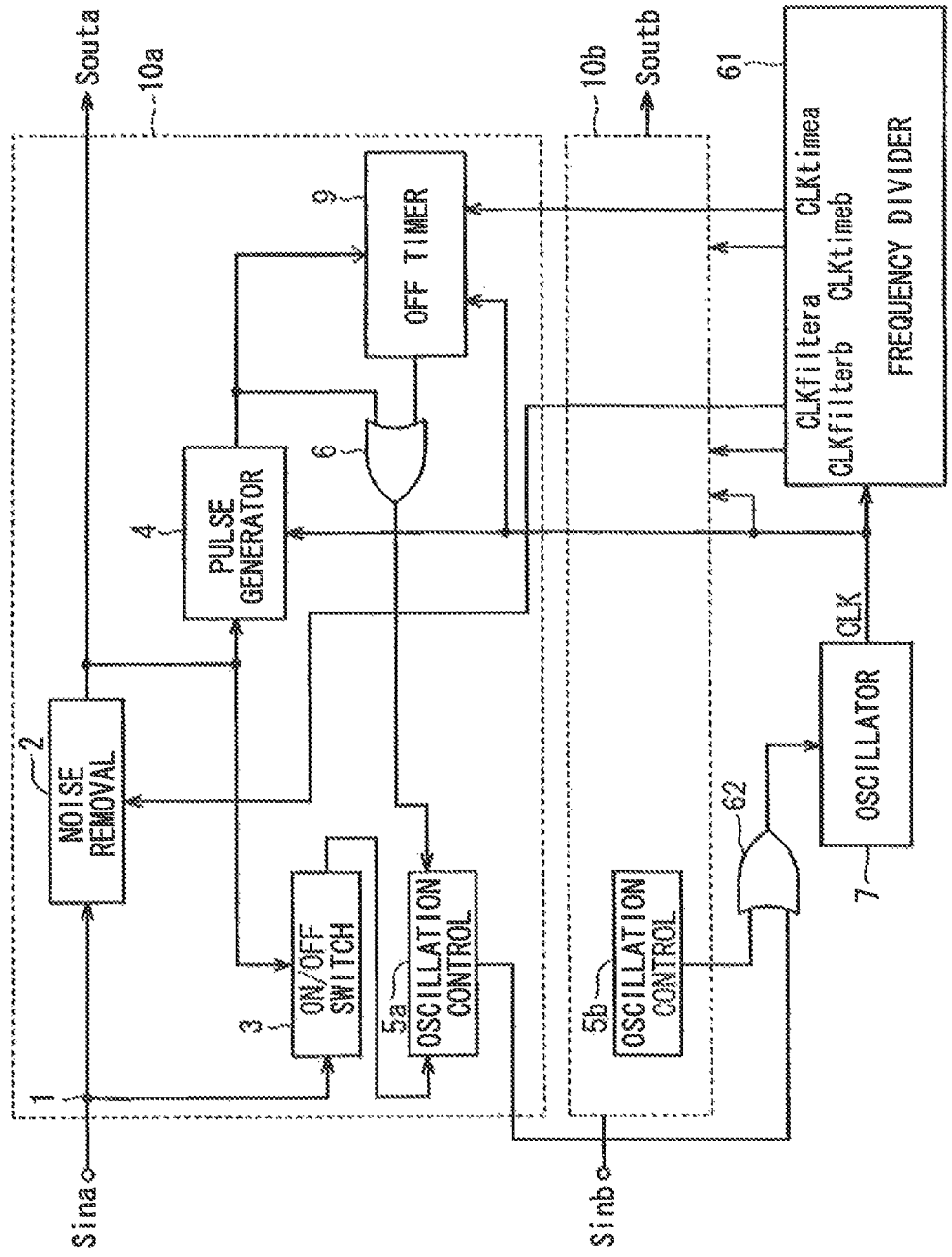
FIG. 5 is a functional block diagram of an input signal processing device according to a second embodiment of the present disclosure.
Figure 6:
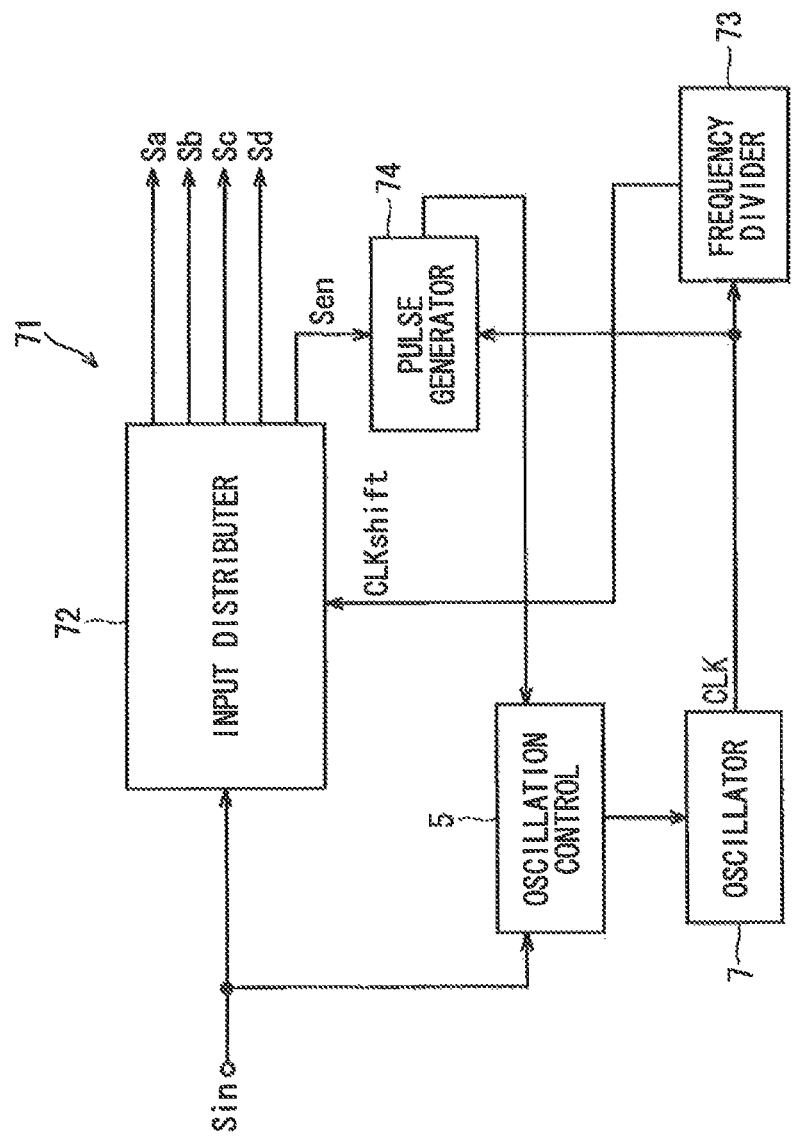
FIG. 6 is a functional block diagram of an input signal processing device according to a third embodiment of the present disclosure.

Next, a case where only noise is inputted will be described with reference to FIG. 4. When only impulse noise is inputted, the Schmitt trigger buffer 11 outputs a signal Ssch having a shaped waveform. Because a high level pulse corresponding to the noise is inputted, the ON/OFF switch circuit 3 brings the oscillation start signal Ostart to the high level. Accordingly, the oscillation control signal Ocont transitions to the high level, and the oscillator circuit 7 starts the oscillation operation to output the control signal CLK. Then, the frequency divider circuit 8 outputs the divided clock signals CLKfilter, CLKtime.

However, in the noise removal circuit 2, the input terminal D of the D flip flop 12 is not steadily at the high level. Thus, the filter output signal Sout does not transition to the high level even when the divided clock signal CLKfilter is inputted, and the filter output signal Sout keeps the low level. Then, the off timer circuit 9 starts a count operation based on the divided clock signal CLKtime without being reset.

Hereafter, signals outputted from the output terminals Q of the D flip flops 48-51 are referred to as Q1-Q4, respectively. As shown in FIG. 4, the signal Q1 transitions to the high level at the first rising of the divided clock signal CLKtime, and the signal Q2 transitions to the high level at the next rising. The signal Q3 transitions to the high level at the second rising after that, and the signal Q4 transitions to the high level at the fourth rising after that. When the off timer circuit 9 receives the rising edge of the clock signal CLK in a state where the signal Q4 is at the high level, the off timer circuit 9 outputs a one-shot pulse signal Soff that keeps the high level until the next rising edge is inputted.

The one-shot pulse signal Soff is inputted to the oscillation control circuit 5 via the OR gate 6, and the falling edge of the one-shot pulse Soff signal triggers the D flip flop 26. Thus, the oscillation control signal Ocont transitions to the low level. Accordingly, the oscillator circuit 7 stops the oscillation operation to output the clock signal CLK. A period for which the oscillation control signal Ocont keeps the high level corresponds to an off time.

Because the noise removal circuit 2 operates in synchronization with the divided clock signal CLKtime, even when the external input signal Sin includes a signal component that changes in a time shorter than the period of the divided clock signal CLKtime, the signal component is removed without being outputted. In other words, the noise removal circuit 2 functions as a kind of digital filter (low pass filter).

As described above, according to the present embodiment, the oscillation control circuit 5 instructs the oscillator circuit 7 to start the oscillation operation based on a level change of the external input signal Sin. The oscillation control circuit 5 instructs the oscillator circuit 7 to stop the oscillation operation when the noise removal circuit 2 finishes the process of removing noise included in the rising period and the falling period of the external input signal Sin. In other words, the noise removal circuit 2 performs the noise removal process when the level of the external input signal Sin changes. The oscillator circuit 7 has to output the clock signal CLK only for a period for which the noise removal circuit 2 performs the above-described process. Thus, when the oscillation control circuit 5 controls the oscillation operation of the oscillator circuit 7 as described above, the power consumption of the input signal processing device 10 can be further reduced.

When a state where the level of the external input signal Sin has changed continues for a predetermined time, the one-shot pulse generator circuit 4 outputs the one-shot pulse signal Spulse to stop the oscillation operation of the oscillator circuit 7. When the state where the level of the external input signal Sin has changed does not continue for a time longer than the period of the clock signal, the off timer circuit 9 outputs the one-shot pulse signal Soff to stop the oscillation operation of the oscillator circuit 7 after the off time that is equal to or longer than the predetermined time has elapsed.

When noise is inputted, a level of the noise changes in a short time. Thus, when the state where the level of the external input signal Sin has changed continues for the predetermined time, it can be determined that the external input signal Sin is a normal input signal. Because the noise removal circuit 2 does not have to operate after the noise removal circuit 2 removes noise included at a time when the level of the external input signal has changed, the one-shot pulse generator circuit 4 outputs the one-shot pulse signal Spulse after the noise removal circuit 2 removes the noise, so as to stop the oscillation operation of the oscillator circuit 7.

When the state where the level of the external input signal has changed does not continue for the time equal to or longer than the period of the clock signal CLKfilter, it can be determined that not a normal external input signal but noise is inputted. Thus, the off timer circuit 9 outputs the one-shot pulse signal to stop the oscillation operation of the oscillator circuit 7 after the off time that is equal to or longer than the predetermined time has elapsed. Thus, the oscillation operation of the oscillator circuit 7 can be stopped after the noise removal circuit 2 operates to remove noise.

Because the noise removal circuit 2 includes the D flip flops 12, 13, the NAND gates 14-17, and the NOT gates 18, 19, a generation time of noise to be removed can be controlled in accordance with the period of the divided clock signal CLKfilter supplied to the D flip flops 12, 13. When a state where the level of the filter output signal Sout outputted from the noise removal circuit 2 has changed continues, the one-shot pulse generator circuit 4 triggered by the clock signal CLK outputted from the oscillator circuit 7. In addition, the off timer circuit 9 performs the count operation using the counter configured by the D flip flops 48-51 based on the divided clock signal CLKtime to output the second trigger signal.

Thus, when the level of the normal external input signal changes, the first trigger signal is immediately inputted to stop the operation of the oscillator circuit 7. In addition, the off time for a case where noise is inputted can be set using the divided clock signal CLKtime and the configuration of the counter in the off timer circuit 9.

(Second Embodiment)

In a second embodiment of the present disclosure, two input signal processing devices 10a, 10b are provided so as to correspond to two external input signals Sina, Sinb and the two input signal processing devices 10a, 10b respectively output filter output signals Souta, Soutb. The input signal processing devices 10a, 10b share the oscillator circuit 7 and a frequency divider circuit 61 that supply the clock signal CLK and the divided clock signals CLKfilter, CLKtime.

Oscillation control circuits 5a, 5b respectively included in the input signal processing devices 10a, 10b output oscillation control signals to the oscillator circuit 7 via the OR gate 62. Accordingly, the oscillation operation of the oscillator circuit 7 is controlled based on a logical sum condition of the oscillation control signals outputted from the oscillation control circuits 5a, 5b in accordance with level changes of the external input signals Sina, Sinb.

The oscillator circuit 7 supplies the clock signal CLK to the input signal processing devices 10a, 10b. The frequency divider circuit 61 supplies divided clock signals CLKfiltera, CLKtimea to the input signal processing device 10a and supplies divided clock signals CLKfilterb, CLKtimeb to the input signal processing device 10b. The divided clock signals CLKfiltera, CLKfilterb are different from each other and the divided clock signals CLKtimea, CLKtimeb are different from each other. This is because the frequency divider circuit 61 corresponds to a case where kinds of noise to be removed by the input signal processing devices 10a, 10b are different from each other. In a case where kinds of noise to be removed by the input signal processing devices 10a, 10b are the same, the frequency divider circuit 8 described in the first embodiment may supply common divided clock signals CLKfilter, CLKtime.

As described above, according to the second embodiment, in a case where the two input signal processing devices 10a, 10b are provided so as to correspond to the two external input signals Sina, Sinb, the oscillator circuit 7 and the frequency divider circuit 61 are shared. Thus, a size of the whole system can be reduced.

(Third Embodiment)

An input signal processing device 71 according to a third embodiment of the present disclosure will be described with reference to FIG. 6 to FIG. 9. The input signal processing device 71 performs a different process to an external input signal compared with the input signal processing device 10 according to the first embodiment and the input signal processing devices 10a, 10b according to the second embodiment. The input signal processing device 71 includes an input distributor circuit 72 (signal processing circuit) instead of the noise removal circuit 2. The input signal processing device 71 receives a divided clock signal CLKshift from a frequency divider circuit 73. The input distributor circuit 72 includes a shift register (see FIG. 7), and outputs signals Sa-Sd shifted with the divided clock signal CLKshift from different output terminals. A one-shot pulse generator circuit 74 (stop signal output circuit) receives an enable signal (Sen) from the input distributor circuit 72 and outputs a trigger signal to an oscillation control circuit 5 to stop an oscillation operation.

Figure 7:
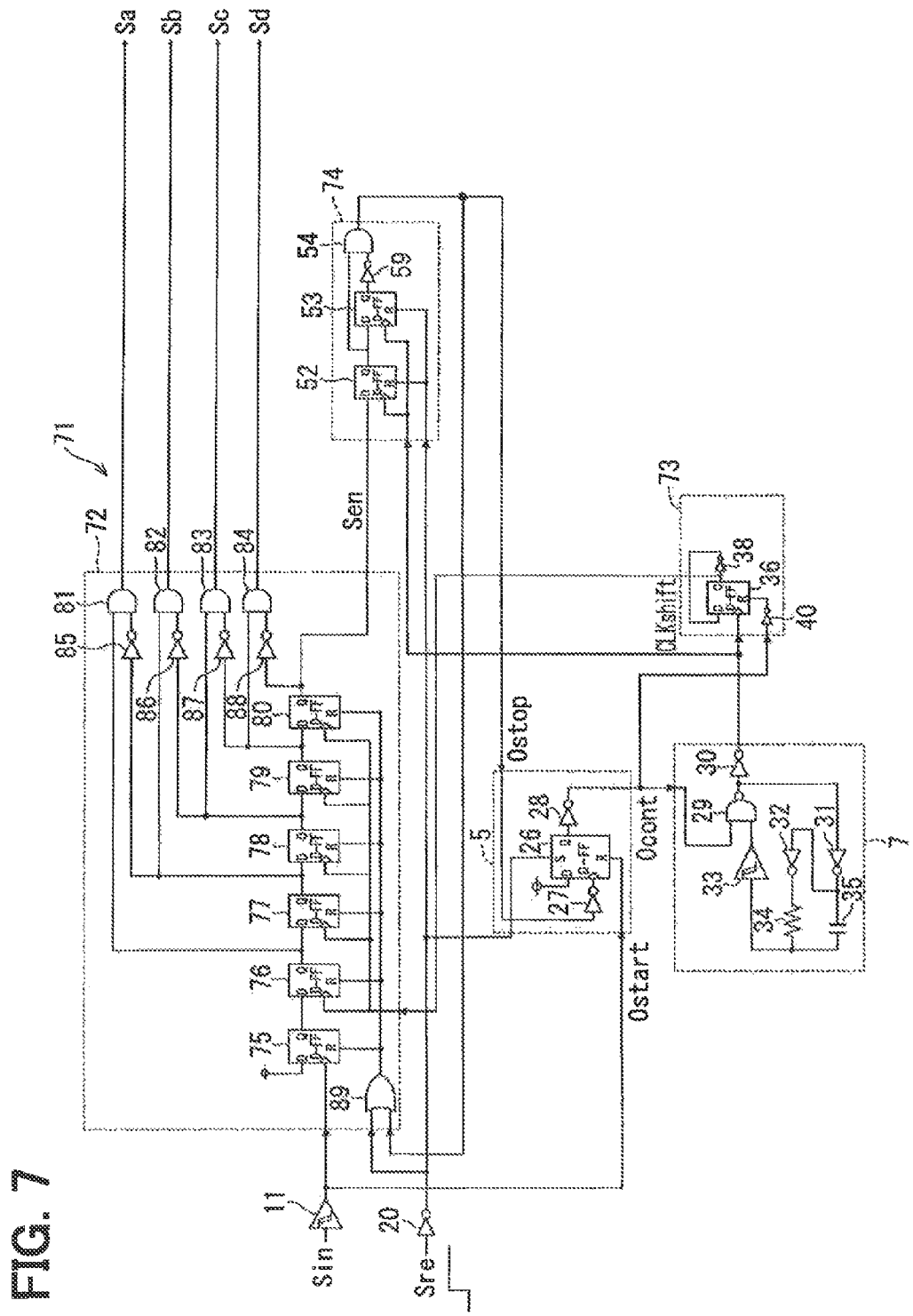
FIG. 7 is a circuit diagram of the input signal processing device shown in FIG. 6.
Figure 8:
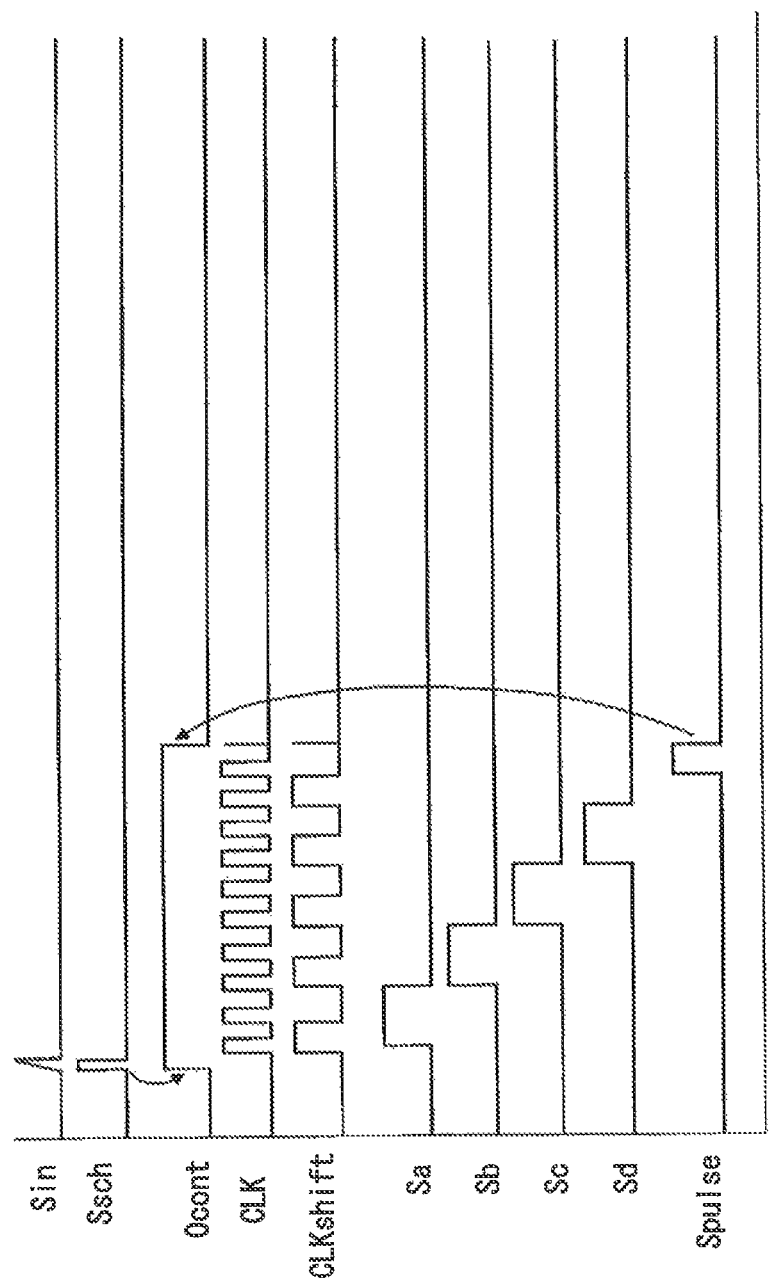
FIG. 8 is a timing chart showing an example of an operation of the input signal processing device according to the third embodiment.

As shown in FIG. 7, the input distributor circuit 72 includes D flip flops 75-80, AND gates 81-84, NOT gates 85-88, and an OR gate 89. The D flip flops 75-80 are coupled in series. An input terminal D of the D flip flop 75 is pulled up to a power source level, and a clock terminal of the D flip flop 75 is coupled to an output terminal of a Schmitt trigger buffer 11. Clock terminals of the D flip flops 76-80 receive the divided clock signal CLKshift.

An output terminal Q of the D flip flop 76 is coupled to one input terminal of the AND gate 81. An output terminal of the D flip flop 77 is coupled to the other input terminal of the AND gate 81 via the NOT gate 85, and is also coupled to one input terminal of the AND gate 82. An output terminal Q of the D flip flop 78 is coupled to the other input terminal 82 of the AND gate 82 via the NOT gate 86, and is also coupled to one input terminal of the AND gate 83.

An output terminal Q of the D flip flop 79 is coupled to the other input terminal of the AND gate 83, and is also coupled to one input terminal of the AND gate 84. An output terminal Q of the D flip flop 80 is coupled to the other input terminal of the AND gate 84 via the NOT gate 88. The distributed signals Sa-Sd are outputted from the output terminals of the AND gates 81-84. Input terminals of the OR gate 89 are coupled to an output terminal of the NOT gate 20 and an output terminal of the one-shot pulse generator circuit 74. An output terminal of the OR gate 89 is coupled to reset terminals R of the D flip flops 75-80.

The one-shot pulse generator circuit 74 includes D flip flops 52, 53, an AND gate 54, and a NOT gate 59 in a manner similar to the off timer circuit 9. An input terminal of the D flip flop 52 is coupled to an output terminal Q of the D flip flop 80. In other words, the enable signal Sen is outputted from an output terminal Q of the D flip flop 80. The frequency divider circuit 73 includes a D flip flop 36 and NOT gates 38, 40 in a manner similar to the frequency divider circuit 8. The divided clock signal CLKshift is outputted from the output terminal Q of the D flip flop 36.

Next, an example of an operation of the input signal processing device 71 will be described. When the Schmitt trigger buffer 11 receives a pulsed external input signal Sin, the Schmitt trigger buffer 11 outputs a signal Ssch having a shaped waveform. The signal Ssch functions as an oscillation start signal. Then, the D flip flop 26 in the oscillation control circuit 5 is set to output an oscillation control signal Ocont at the high level, and the oscillator circuit 7 starts the oscillation operation to output the clock signal CLK. Accordingly, the frequency divider circuit 73 outputs the divided clock signal CLKshift.

Because the signal outputted from the Schmitt trigger buffer 11 triggers the D flip flop 75, the output terminal Q of the D flip flop 75 transitions to the high level. The D flip flops 76-80 are triggered by the rising edge of the divided clock signal CLKshift. Thus, the output terminals of the flip flops 76-80 sequentially transition to the high level with each time the rising edge of the divided clock signal CLKshift is inputted.

At a time when the output terminal Q of the D flip flop 76 first transitions to the high level, the output terminal Q of the D flip flop 77 in the next stage is at the low level. Thus, the signal Se outputted from the output terminal of the AND gate 81 transitions to the high level. At a time when the output terminal Q of the D flip flop 77 first transitions to the high level, the output terminal Q of the next D flip flop 78 in the next stage is at the low level. Thus, the signal Sb outputted from the output terminal of the AND gate 82 transitions to the high level. At this time, because both of the output terminals Q of the D flip flops 76, 77 are at the high level, the signal Sa outputted from the output terminal of the AND gate 81 transitions to the low level.

After that, each time the rising edge of the divided clock signal CLKshift is inputted, the signals Sc, Sd outputted from the output terminals of the AND gates 83, 84 exclusively transition to the high level. When the output terminal of the flip flop 80 in the last stage transitions to the high level (active level of the enable signal Sen) and the rising edge of the clock signal CLK is inputted, the one-shot pulse generator circuit 74 outputs the one-shot pulse signal Spulse as the trigger signal. Accordingly, the oscillation operation of the oscillator circuit 7 is stopped via the oscillation control circuit 5.

In the input signal processing device 71 according to the third embodiment, the input distributor circuit 72 functions as a shift register that sequentially performs time-shift of the external input signal based on the divided clock signal CLKshift outputted from the frequency divider circuit 73 and outputs the signals after the time-shift from different output terminals. When the one-shot pulse generator circuit 74 receives the enable signal Sen from the D flip flop 80 in the last stage of the shift register, the one-shot pulse generator circuit 74 outputs the trigger signal Spulse to stop the oscillation operation of the oscillator circuit 7. Thus, the oscillator circuit 7 can operate only for a period for which the input distributor circuit 72 performs the time-shift operation of the external input signal, and power consumption can be reduced.

(Fourth Embodiment)

Figure 9:
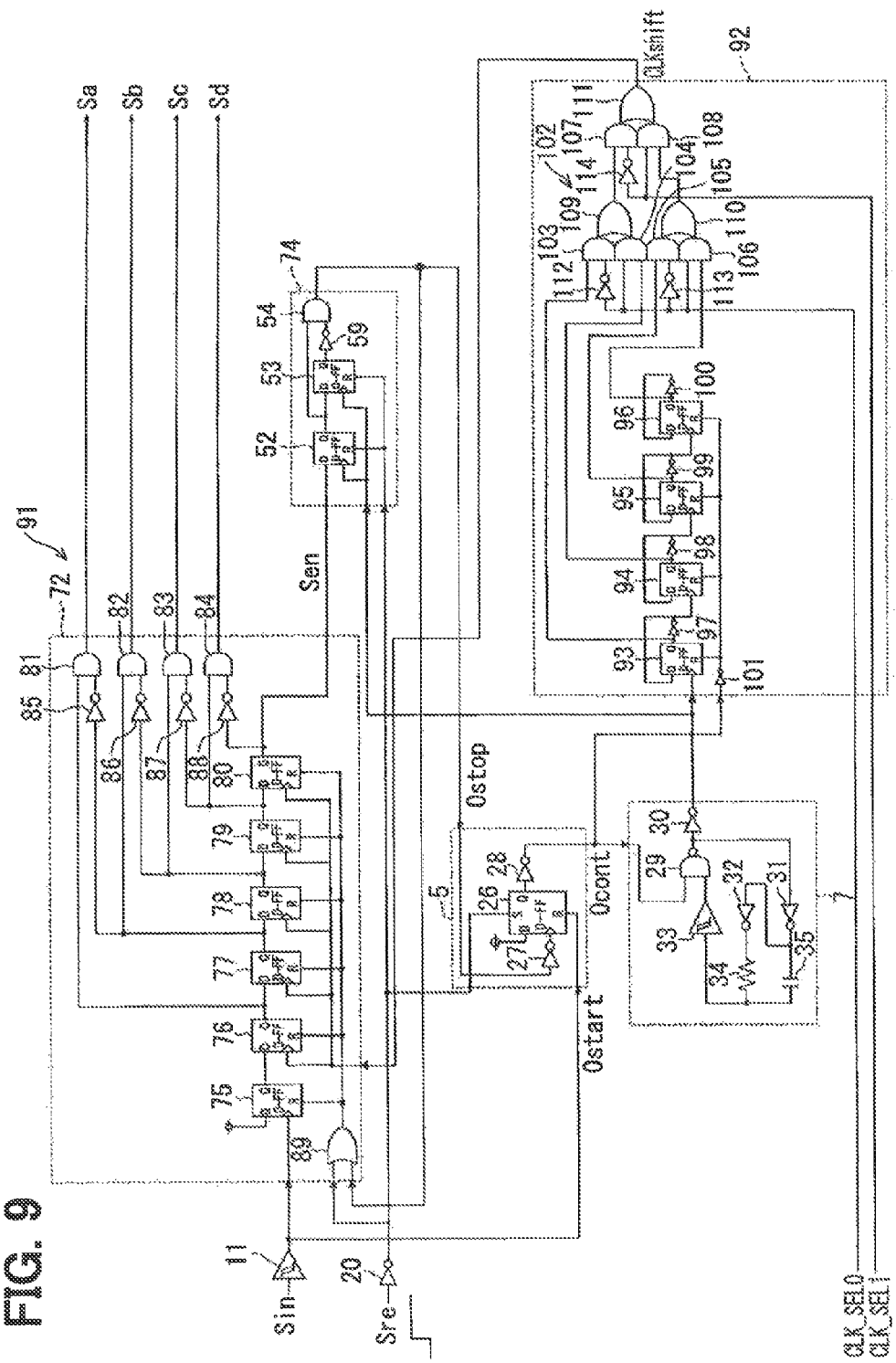
FIG. 9 is a circuit diagram of the input signal processing device according to a fourth embodiment of the present disclosure.

An input signal processing device 91 according to a fourth embodiment of the present disclosure will be described with reference to FIG. 9. The input signal processing device 91 includes a frequency divider circuit 92 instead of the frequency divider circuit 73 in the input signal processing device 71 according to the third embodiment. The frequency divider circuit 92 includes D flip flops 93-96 and NOT gates 97-100, which are coupled in a manner similar to the D flip flops 48-51 and the NOT gates 55-58 included in the off timer circuit 9. Reset terminals R of the D flip flops 93-96 receive an oscillation stop signal (Ostop) outputted from the oscillation control circuit 5 via a NOT gate 101.

An output logic portion 102 includes AND gates 103-108, OR gates 109-111, and NOT gates 112-114. Output terminals Q of the D flip flops 93-96 are respectively coupled to input terminals of the AND gates 103-106. A control signal CLK_SEL0 from an external device is inputted to the other input terminals of the AND gates 104, 106, and is inputted to the other input terminals of the AND gates 103, 105 via the NOT gates 112, 113. Input terminals of the OR gate 109 are coupled to output terminals of the AND gates 103, 104. Input terminals of the OR gate 110 are coupled to output terminals of the AND gates 105, 106.

Output terminals of the OR gates 109, 110 are respectively coupled to input terminals of the AND gates 107, 108. A control signal CLKSEL1 from an external device is inputted to the other input terminal of the AND gate 108, and is inputted to the other input terminal of the AND gate 107 via the NOT gate 114. Input terminals of the OR gate 111 is coupled to output terminals of the AND gates 107, 108. From an output terminal of the OR gate 111, a divided clock signal CLKshift is outputted.

Next, an example of an operation of the input signal processing device 91 according to the fourth embodiment will be described. The frequency divider circuit 92 can change a frequency dividing ratio of the divided clock signal CLKshift when levels of the clock signals CLK_SEL0, CLK_SEL1 are changed. The following (i)-(iii) are cases shown in FIG. 10.

(i) A case where CLK_SEL0=L, CLK_SEL1=L

In this case, because the output terminals of the NOT gates 112-114 are at the high level, the output terminal Q of the D flip flop 93 coupled to the AND gate 103 is selected and the divided clock signal CLKshift is outputted. In other words, the frequency dividing ratio is set to 2 in a manner similar to the third embodiment.

(ii) A case where CLK_SEL0=H, CLK_SEL1=L

In this case, the output terminal Q of the D flip flop 94 coupled to the AND gate 104 is selected and the divided clock signal CLKshift is outputted. Thus, the frequency dividing ratio is set to 4.

(iii) A case where CLK_SEL0=L, CLK_SEL1=H

In this case, the output terminal Q of the D flip flop 95 coupled to the AND gate 105 is selected and the divided clock signal CLKshift is outputted. Thus, the frequency dividing ratio is set to 8. By changing the frequency dividing ratio as described above, as shown in FIG. 10, pulse widths of signals Sa-Sd are changed in such a manner that pulse widths correspond to 2 cycles, 4 cycles, and 8 cycles of the clock signal CLK.

Figure 10:
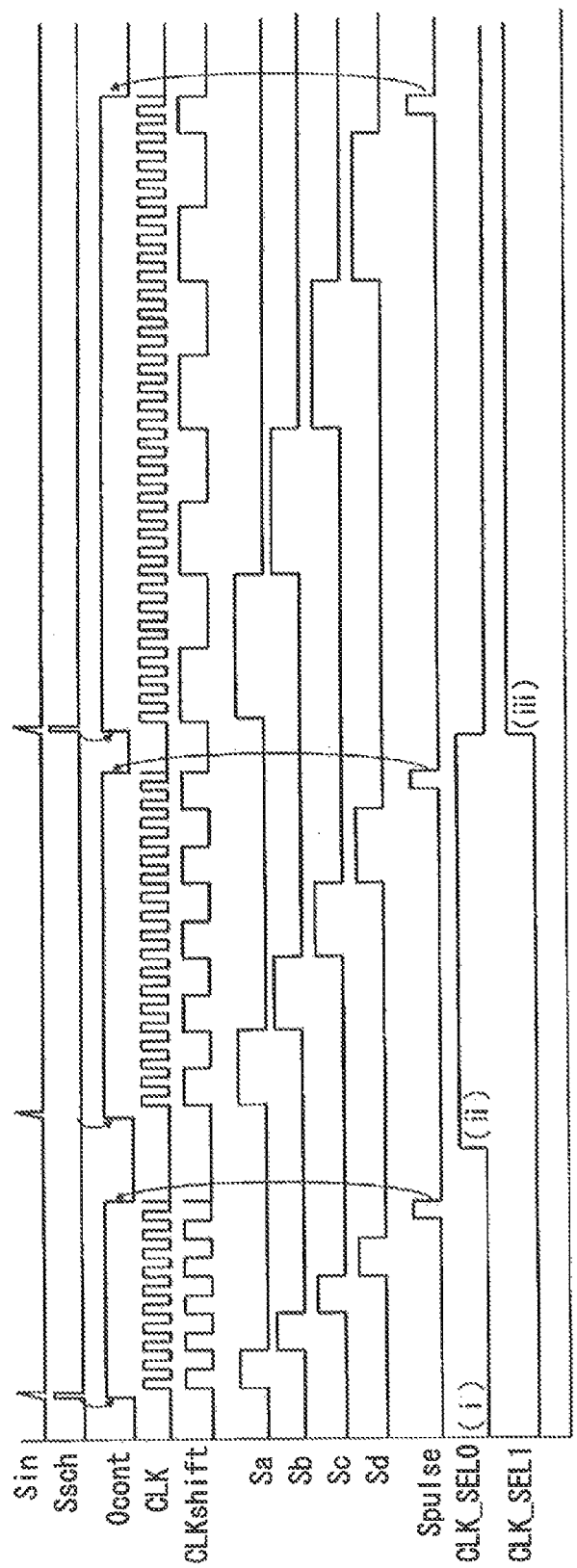
FIG. 10 is a timing chart showing an example of an operation of the input signal processing device according to the fourth embodiment.

Although it is not shown in FIG. 10, in a case where CLK_SEL0=H, CLK_SEL1=H, the output terminal Q of the D flip flop 96 coupled to the AND gate 106 is selected and the divided clock signal CLKshift is outputted. Thus, the frequency dividing ratio is set to 16. In the input signal processing device 91 according to the fourth embodiment, the frequency dividing ratio of the frequency divider circuit 92 can be changed. Thus, pulse widths of signals outputted from different terminals of the input distributor circuit 72, which distributes the external input signal with time-shift, can be changed.

While only the selected exemplary embodiments have been chosen to illustrate the present disclosure, it will be apparent to those skilled in the art from this disclosure that various changes and modifications can be made therein without departing from the scope of the disclosure as defined in the appended claims. The present disclosure can be applied to any signal processing device that performs a predetermined process in accordance with a level change of an input signal. The oscillator circuit may include a crystal oscillator or a ring oscillator. The frequency dividing ratio of the frequency divider circuit may be optionally changed. The off time measured by the off timer circuit 9 may be optionally changed based on an individual design.

What is claimed is:

1. An input signal processing device comprising:
   an oscillator circuit performing an oscillation operation to output a clock signal;
   a signal processing circuit operating based on the clock signal outputted from the oscillator circuit, the signal processing circuit performing a predetermined process to an input signal when a level of the input signal changes and outputting a signal after the predetermined process;
   a control circuit instructing the oscillator circuit to start the oscillation operation based on a level change of the input signal, the control circuit instructing the oscillator circuit to stop the oscillation operation when the signal processing circuit finishes the predetermined process, wherein
   the signal processing circuit includes a noise removal circuit that removes noise included in a rising period and a falling period of the input signal.

2. The input signal processing device according to claim 1, wherein
   the control circuit includes a first stop signal output circuit and a second stop signal output circuit,
   when a state where the level of the input signal has changed continues for a predetermined time, the first stop signal output circuit outputs a first trigger signal to stop the oscillation operation of the oscillator circuit, and
   when the state where the level of the input signal has changed does not continue for the predetermined time, the second stop signal output circuit outputs a second trigger signal to stop the oscillation operation of the oscillator circuit after an off time that is equal to or longer than the predetermined time has elapsed.

3. The input signal processing device according to claim 2, wherein
   the noise removal circuit includes a digital filter circuit.

4. The input signal processing device according to claim 3, wherein
   the noise removal circuit includes a first flip flop, a second flip flop, a first NAND gate, a second NAND gate, a third NAND gate, a fourth NAND gate, and two NOT gates,
   the first flip flop has an input terminal to which the input signal is inputted,
   the second flip flop is coupled in series with the first flip flop,
   the first NAND gate has two input terminals and an output terminal, one of the input terminals of the first NAND gate is coupled to an output terminal of the first flip flop, the other of the input terminals of the first NAND gate is coupled to an output terminal of the second flip flop,
   the second NAND gate has two input terminals and an output terminal, one of the input terminals of the second NAND gate is coupled to the output terminal of the first flip flop via one of the NOT gates, the other of the input terminals of the second NAND gate is coupled to the output terminal of the second flip flop via the other of the NOT gates,
   the third NAND gate has two input terminals and an output terminal, one of the input terminals of the third NAND gate is coupled to the output terminal of the first NAND gate,
   the fourth NAND gate has two input terminals and an output terminal, one of the input terminals of the fourth NAND gate is coupled to the output terminal of the second NAND gate,
   the other of the input terminals of the third NAND gate is coupled to the output terminal of the fourth NAND gate, and
   the other of the input terminals of the fourth NAND gate is coupled to the output terminal of the third NAND gate.

5. The input signal processing device according to claim 4, wherein
   when a state where a level of a signal outputted from the noise removal circuit has changed continues, the first stop signal output circuit is triggered by the clock signal outputted from the oscillator circuit and outputs a one-shot pulse as the first trigger signal,
   the second stop signal output circuit includes a counter that performs a count operation based on the clock signal, and
   the second stop signal output circuit measures a time using the counter.

6. An input signal processing device comprising:
   an oscillator circuit performing an oscillation operation to output a clock signal;
   a signal processing circuit operating based on the clock signal outputted from the oscillator circuit, the signal processing circuit performing a predetermined process to an input signal when a level of the input signal changes and outputting a signal after the predetermined process;
   a control circuit instructing the oscillator circuit to start the oscillation operation based on a level change of the input signal, the control circuit instructing the oscillator circuit to stop the oscillation operation when the signal processing circuit finishes the predetermined process, wherein
   the signal processing circuit includes a shift register that sequentially performs time-shift of the input signal based on the clock signal outputted from the oscillator circuit and outputs signals after the time-shift from different output terminals.

7. The input signal processing device according to claim 6, wherein
   the control circuit includes a stop signal output circuit that outputs a trigger signal to stop the oscillation operation of the oscillator circuit when a signal outputted from a last stage of the shift register is inputted.

* * * * *